United States Patent [19]

Akiyama

[11] Patent Number: 5,046,095
[45] Date of Patent: Sep. 3, 1991

[54] DIGITAL DATA PROCESSOR HAVING DATA-UNSCRAMBLING FUNCTION

[75] Inventor: Kazuhiro Akiyama, Tokyo, Japan
[73] Assignee: NEC Corporation, Japan
[21] Appl. No.: 265,021
[22] Filed: Oct. 31, 1988

[30] Foreign Application Priority Data

Oct. 30, 1987 [JP] Japan .................. 62-276622

[51] Int. Cl.$^5$ .............................. H04L 9/02
[52] U.S. Cl. .......................... 380/50; 380/4; 364/255.8; 364/955.6
[58] Field of Search .............. 380/49, 50, 3.4; 364/200, 900, 255.8, 955.6, 961, 961.4

[56] References Cited

U.S. PATENT DOCUMENTS

| | | | |
|---|---|---|---|
| 4,087,626 | 5/1978 | Brader | 364/900 |
| 4,320,466 | 3/1982 | Myers | 364/900 |
| 4,465,901 | 8/1984 | Best | 364/200 |
| 4,661,980 | 4/1987 | Byram | 380/50 |
| 4,771,462 | 9/1988 | Hannan et al. | 380/50 |
| 4,797,928 | 1/1989 | Dykes | 380/49 |
| 4,837,821 | 6/1989 | Kage | 380/49 |

Primary Examiner—Thomas H. Tarcza
Assistant Examiner—Tod Swann
Attorney, Agent, or Firm—Laff, Whitesel, Conte & Saret

[57] ABSTRACT

A data processor includes a data unscrambling unit. The unit includes a memory circuit for storing data supplied thereto in a scrambled form, the data stored in the memory circuit being thereafter read out therefrom in an order which is to be the unscrambled form. The memory circuit includes a memory cell array, a set of first terminals supplied with a write address having a value which is changed one by one, a data write control circuit for writing data into the memory cell array in a first order in accordance with changes in value of the write address. A set of second terminals is supplied with a read address having a value which is changed one by one. A data read control circuit reads out data from the memory cell array in a second order that is different from the first order, the read out being in accordance with a change in value of the read address.

15 Claims, 7 Drawing Sheets

DIGITAL DATA PROCESSOR HAVING DATA-UNSCRAMBLING FUNCTION

BACKGROUND OF THE INVENTION

The present invention relates to a digital data processor and, more particularly, to such a processor having a unit for unscrambling a string of data which have been received in a scrambled.

In order to reduce an error rate of information to be transferred or reproduced, a data-scrambling technique is widely employed. For example, in a compact disk (CD) system, an analog signal representative of music information or the like is converted into a string of digital data, each data being called a "symbol" and consisting of eight bits. Each symbol data is modulated to fourteen bits through well-known Eight-to-Fourteen Modulation (EFM). The string of modulated symbol data is scrambled and then recorded on a compact disk together with parity information that is used for making an error correction.

In a playback or reproduce processing therefore, the data recorded into the disk are read out therefrom and then subjected to an EFM demodulation. The string of demodulated symbol data is supplied to an error correction processing unit which executes a so-called C1 correction and C2 correction. Then the corrected data is transferred to an unscrambling unit in order to obtain the unscrambled data string. The unscrambling unit includes a semiconductor memory. The string of data from the error correction processing unit is once written into the memory. The data stored in the memory are thereafter read out in the order to be unscrambled.

However, the semiconductor memory employed by the prior art in the unscrambling unit has only one set of address terminals. A write address and a read address are supplied in common to the set of address terminals. Moreover, in a case where the write and read addresses have the same value, the same word line is driven to select memory cells arranged in the same row in both a data write operation and a data read operation. For this reason, when the string of symbol data derived from the error correction processing unit is written into the memory in the order of the address thereof, a read address calculation circuit is required to read the data from the memory in the order to be unscrambled. Or else, a write address calculation circuit is required to write the string of data into the memory at addresses corresponding to the order to be unscrambled. The data written into the memory is read out in the order of the address. Particularly, in a case where the EFM demodulation, C1 and C2 correction and read and write address calculation are performed by a single data processor, these processing operations must be performed in time-sharing, so that a very high speed processor is required.

SUMMARY OF THE INVENTION

Therefore, an object of the present invention is to provide a data processor including an improved semiconductor memory circuit.

Another object of the present invention is to provide a semiconductor memory wherein data stored therein can be read out in an order which is different from the writing-order of the string of data.

Still another object of the present invention is to provide a data processor including a semiconductor memory which is suitable for a data-unscrambling processing operation.

A data processor according to the present invention comprises a memory circuit having means for supplying a write address to the memory circuit to write data therein, and means for supplying a read address to the memory circuit to read data therefrom. The memory circuit includes a set of write address terminals for receiving the write address, a set of read address terminals for receiving the read address, a plurality of word lines, a plurality of bit lines crossing the word lines and, a plurality of memory cells disposed at intersections of the word and bit lines. Means are coupled to the set of write address terminals for selecting and driving one of the word lines in response to the write address. Means are coupled to the set of read address terminals and are responsive to the read address for selecting and driving one of the word lines which is different from the word line which is selected in response to the write address having the same value as the read address.

Therefore, the string of data written into the memory circuit is read out therefrom in an order which is different from the writing order thereof, only by the sequential change of the read address. Thus, the data unscrambling processing operation can be carried out without requiring an address calculation. Moreover, since the write address terminals and read address terminals are independent of each other, a plurality of memory circuits can be connected in parallel. Thus, a string of data can be written into one of the memory circuits while the unscrambling processing for the preceding string of data is executing by a use of the remaining one or ones of the memory circuits.

BRIEF DESCRIPTION OF THE DRAWINGS

The above and other objects, advantages and features of the present invention will be more apparent from the following description taken in conjunction with the accompanying drawings, in which.

DETAILED DESCRIPTION OF THE PREFERRED EMBODIMENT

In order to facilitate the understanding of the features and advantages of the present invention, the following description will be made on a basis that the invention is used in a compact disk player system.

Figure 6:
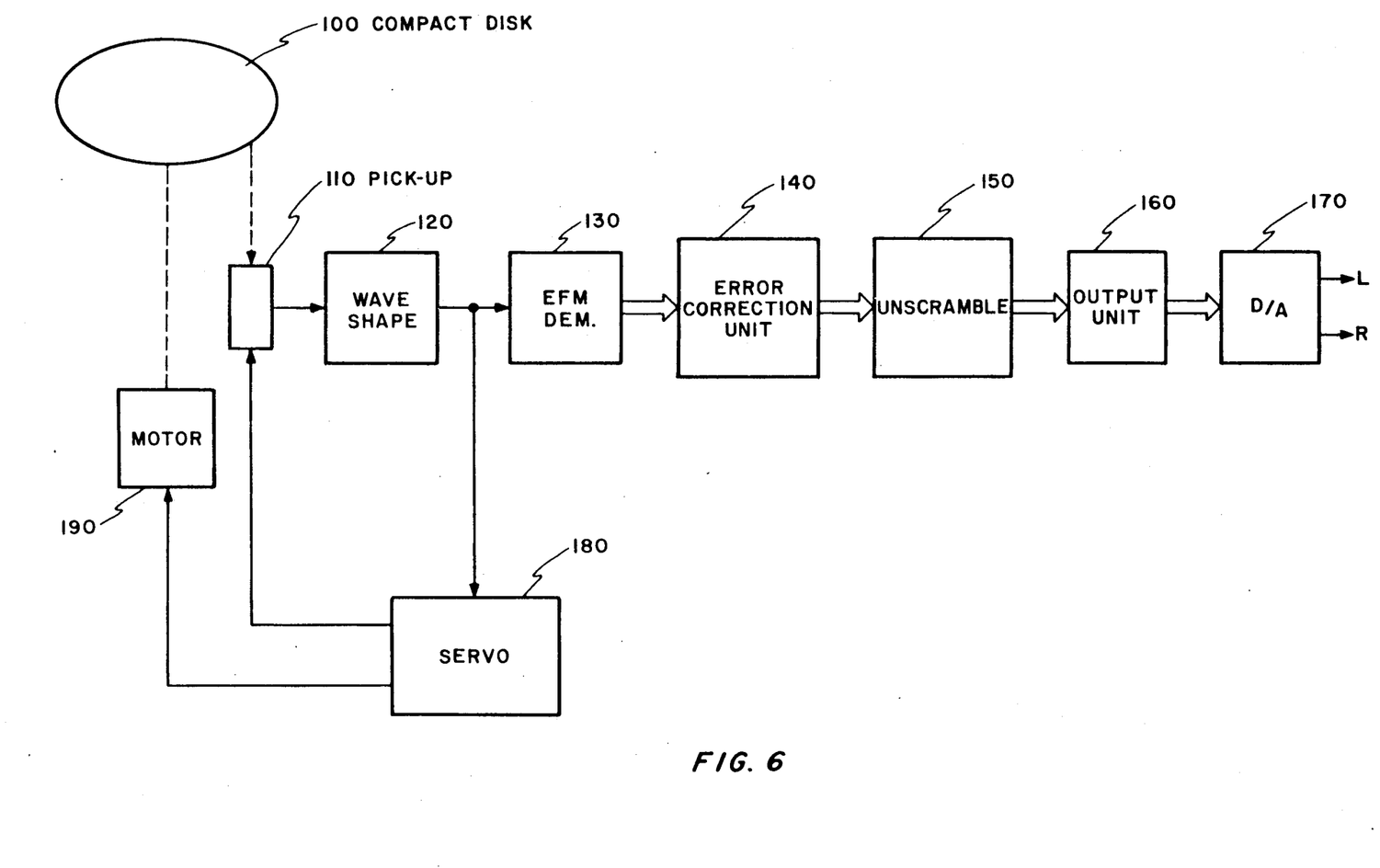
FIG. 6 is a block diagram which is representative of a compact disk player system.

At first, the compact disk player system will be briefly described with reference to FIG. 6. Each bit information recorded on a compact disk 100 is read out by a pickup 110. One data, i.e. one symbol, on the disk 100 consists of fourteen bits in accordance with the EFM. The signal derived from the pickup 110 is converted into a pulse signal by a wave-shaping unit 120 and then supplied to an EFM demodulation unit 130 which in turn demodulates each symbol from fourteen bits to eight bits.

The output signal of the wave-shaping unit 120 is further supplied to a servo unit 180. In response thereto, the servo unit 180 performs focusing and tracking controls over the pickup 110 and further performs the speed control of a spindle motor 190. The data from the EFM demodulation unit 130 are supplied to an error correction processing unit 140. This unit 140 executes the C1 correction for an adjacent two frames, each of which frames consists of 32 symbols. Further, unit 140 executes the C2 correction for 108 frames, to thereby produce one frame data consisting of 28 symbols. Since the EFM demodulation processing and the error correction processing are well known in the art and do not relate directly to the present invention, the further description thereof is omitted.

Since a string of symbols representative of music information is recorded on the disk 100 in a scrambled form, the symbol data from the error correction processing unit 150 are supplied to an unscrambling unit 150. The unscrambled frame data from the unit 150 are supplied to an output processing unit 160 which performs the interpolation operation and/or the previous value holding operation with respect to the symbols which have not succeeded in the error correction. The data from the output processing unit 160 are supplied to a digital-to-analog converter. Thus, left and right audio signals which are representative of music information are reproduced. The further description on the output processing is omitted since that processing is also well known in the art.

Figure 7:
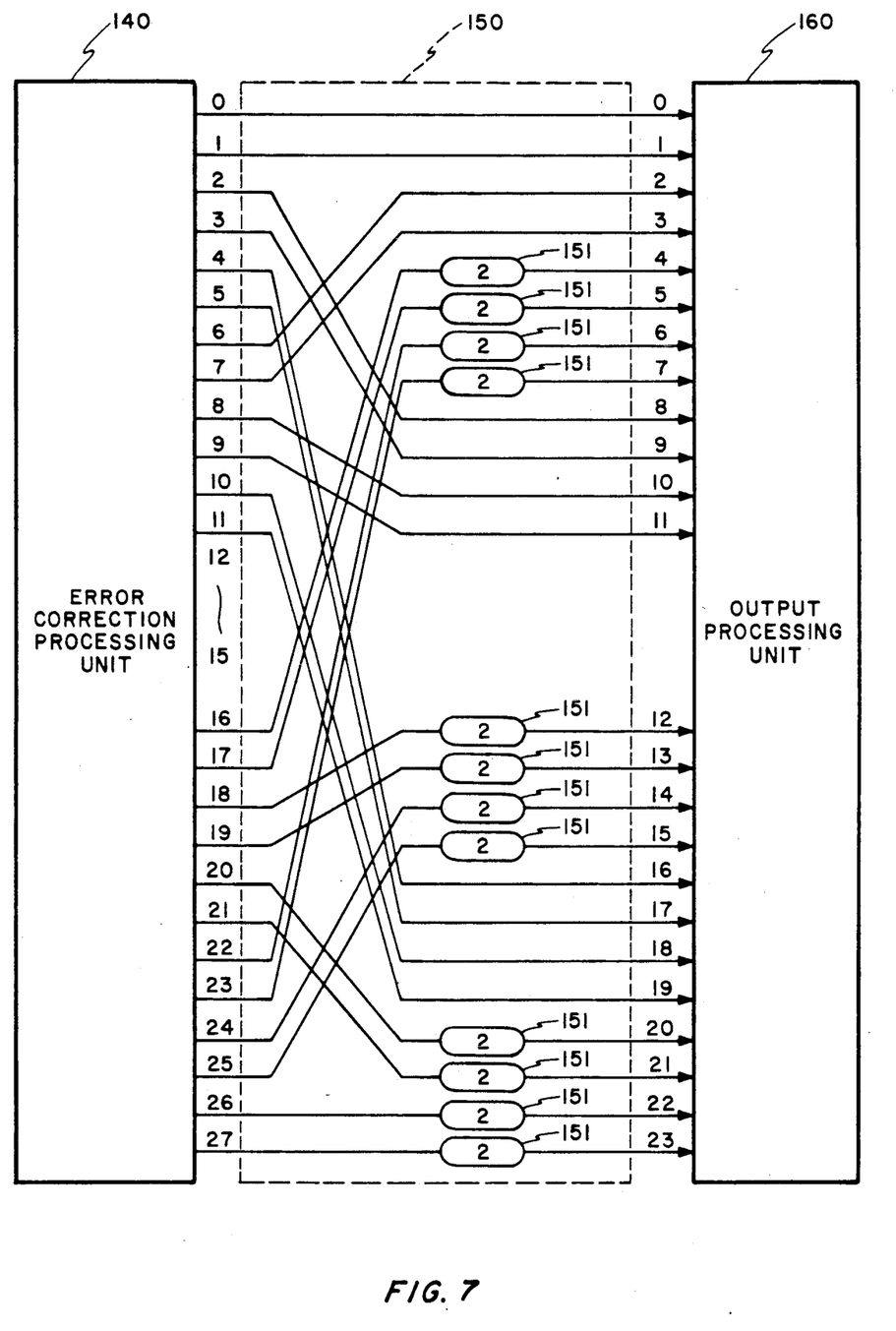
FIG. 7 is a processing diagram of an unscrambling unit shown in FIG. 6.

The unit 140 executes the error correction processing operation in symbol units, and produced 28 symbols constituting one frame. The symbols are produced by the unit 140 one by one in a sequential manner. These symbols are then supplied to the unscrambling unit 150 with write-address 0 ("00000(B)") through write-address 27 ("11011(B)"), respectively, in accordance with the produced order thereof, as shown in FIG. 7. The mark "(B)" denotes a binary number. The symbols of address 12 to address 15 are parity data used for making the error correction and do not have music information.

Accordingly, the unit 150 performs the unscrambling operation shown in FIG. 7 with respect to the symbols of write-address 0 to write-address 11 and write-address 16 to write-address 27. Therefore, the unscrambled frame consists of 24 symbols. Since the unit 150 also performs the output processing operation in symbol units, 24 symbols constituting the unscrambled frame are transferred to the unit 160, one, by one in a sequential manner and thus have respectively read-address 0 ("00000(B)") through read-address 23 ("10111(B)") in accordance with the transferred order thereof, as is also shown in FIG. 7. For example, the symbol of write-address 2 which is the third symbol produced from the unit 140 is transferred ninth to the unit 160 as the symbol of read-address 8. Moreover, as denoted by the reference numeral 151 in FIG. 7, the symbols of write-address 16 to write-address 27 are delayed by a time period corresponding to two frames and are thus used for a frame which is two frames late. Thus, in order to obtain the unscrambled data for some frame, the unit 150 must execute the unscrambling operation shown in FIG. 7 by use of the symbols of write-address 0 to write address 11 in that frame and the symbols of write-address 16 to write-address 27 in a from which is two frames early.

Figure 1:
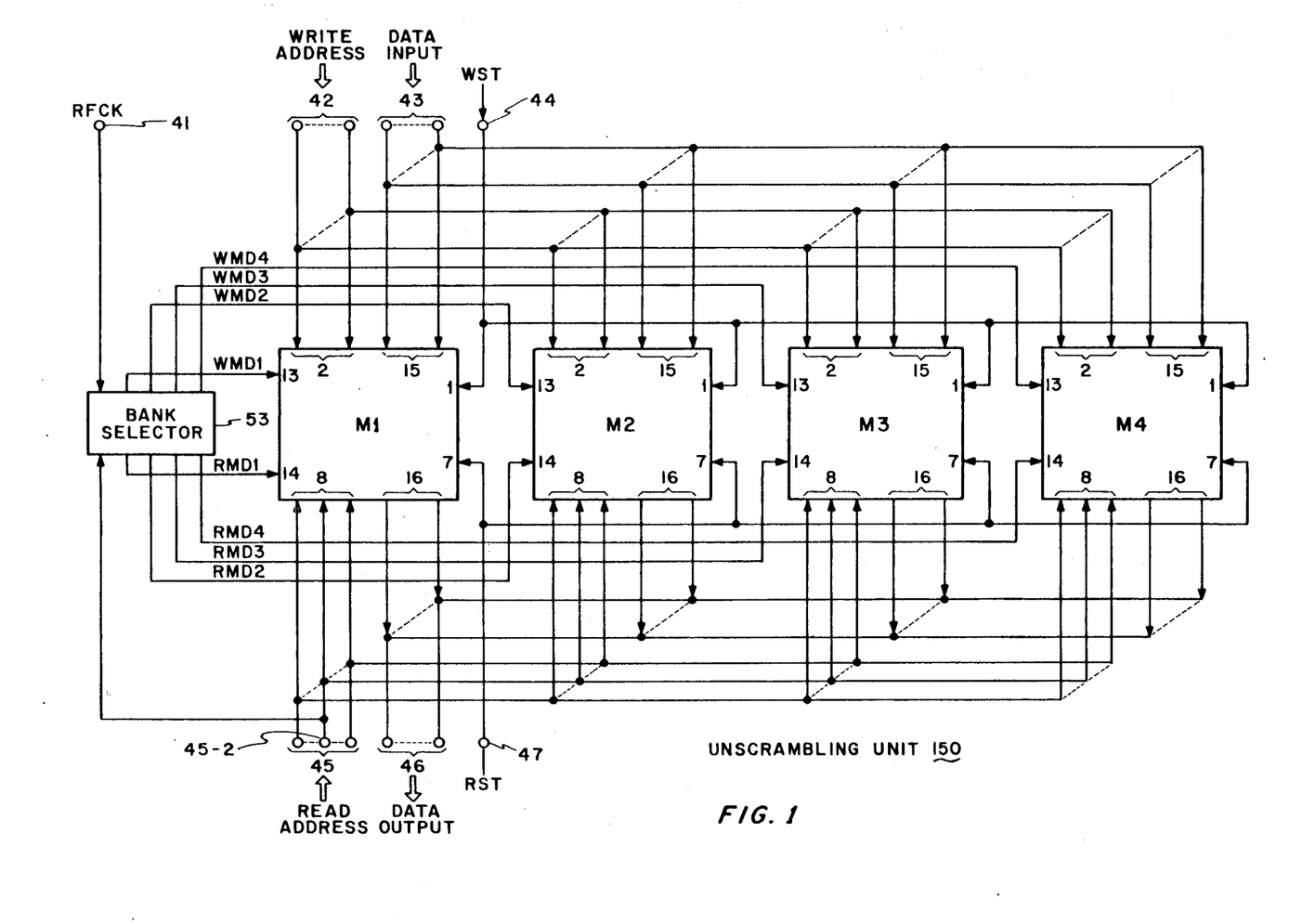
FIG. 1 is a block diagram which is representative of an embodiment of the present invention.
Figure 2:
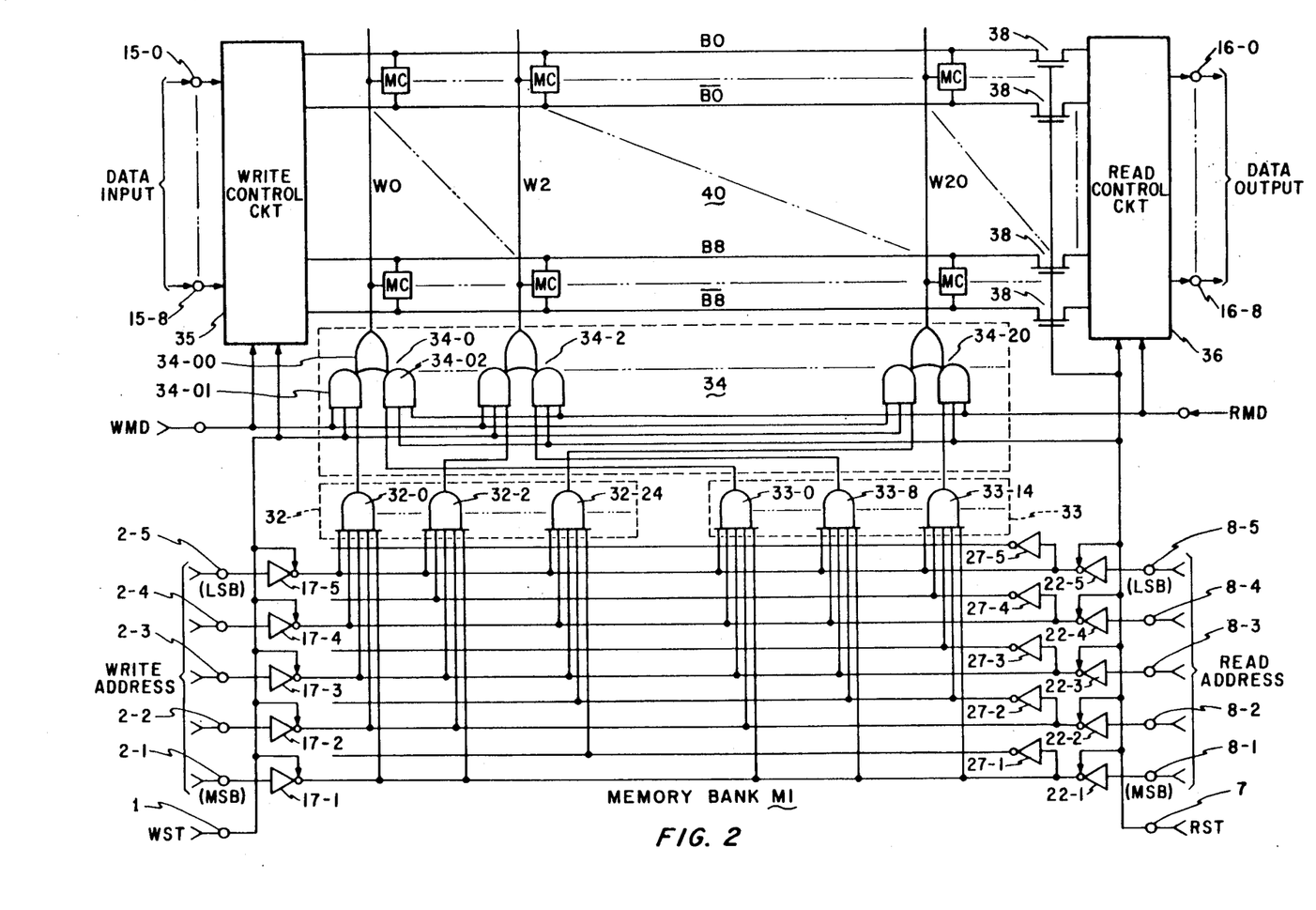
FIG. 2 is a circuit diagram which is representative of a circuit construction of each of memory banks shown in FIG. 1.

Referring to FIG. 1, the unscrambling unit 150 according to an embodiment of the present invention includes four memory banks M1 to M4, each of which has a storage capacity for storing 24 symbols for one frame and is constructed as shown in FIG. 2.

In FIG. 2, each symbol consisting of nine bits is supplied to a set of data input terminals consisting of nine terminals 15-0 to 15-8. The eight bits of the symbol data represent music information. The ninth bit is added by the error correction processing unit 140 to represent whether or not this symbol has succeeded in the error correction. A write-address consists of five bits and is supplied to a set of write address terminals consisting of five terminals 2-1 to 2-5. Independently of the set of write-address terminals 2-1 to 2-5, a set of read address terminals consisting of five terminals 8-1 to 8-5 is provided to receive a read-address consisting of five bits.

The terminals 2-5 and 8-5 are supplied with the least significant bits of the associated write and read addresses. The terminals 2-1 to 2-5 and 8-1 to 8-5 are connected to the inputs of clocked inverters, i.e., tri-state inverters, 17-1 to 17-5 and 22-1 to 22-5, respectively. Each of the inverters 17-1 to 17-5 is activated by a write strobe signal WST applied to a terminal 1 to output the inverted data of the associated bit of the write-address. The outputs of the inverters 17-1 to 17-5 are brought into a high impedance state when deactivated. Similarly, each of the inverters 22-1 to 22-5 is activated by a read strobe signal RST applied to a terminal 7 to output the inverted data of the associated bit of the read-address, the outputs thereof being brought into a high impedance state when deactivated. The outputs of two inverters having the same significant bit, 17-1 and 22-1, 17-2 and 22-2, 17-3 and 22-3, 17-4 and 22-4, and 17-5 and 22-5, are connected in common and further connected to the inputs of inverters 27-1 to 27-5, respectively.

A write address decoder circuit 32 decodes the write address in response to the outputs of the inverters 17-1 to 17-5 and 27-1 to 27-5. Independently of the decoder circuit 32, a read address decoder circuit 33 is provided to decode the read address in response to the outputs of the inverters 22-1 to 22-5 and 27-1 to 27-5. The write address decoder circuit 32 includes 24 decoder units which decode write-address 0 to write-address 11 and write-address 16 to write-address 27, respectively. The read address decoder circuit 33 includes decoder units which decode read-address 0 to read-address 24, respectively. However, in order to avoid the complication of the drawing, only three write decoder units 32-0, 32-2 and 32-24 decoding respectively write-addresses 0, 2 and 24 and only three read decoder units 33-0, 33-8 and 33-14 decoding read-addresses 0, 8 and 14 are shown. Each of the decoder units in the decoder circuits 32 and 33 is composed of an AND gate.

As described hereinbefore, the symbols of write-address 12 to write-address 15 are not used. Therefore, the decoder circuit 32 does not include the decoder units for those addresses.

A memory cell array portion 40 includes 24 word lines W0 to W23, nine pairs of bit lines ($B_0$ and $\overline{B_0}$) to ($B_8$ and $\overline{B_8}$) and 216 memory cells MC disposed at the respective intersections of the word lines and the pairs of bit lines. However the drawing shows only three word lines W0, W2 and W20, two pairs of bit lines ($B_0$ and $\overline{B_0}$) and ($B_8$ and $\overline{B_8}$) and six memory cells MC. As is well known in the art, each of the memory cells MC comprises six MOS transistors or four transistors and two resistors.

A word line driving circuit 34 is further provided. This driving circuit 34 includes 24 driving units 34-0 to 34-23 whose outputs are connected in numerical order to the word lines W0 to W23, respectively. In the drawing, only three driving units 34-0, 34-2 and 34-20 are shown, the outputs being therefore connected to the shown word lines W0, W2 and W20.

Each of the driving units 34-0 to 34-23 includes one OR gate 34-00 and two AND gates 34-01 and 34-02. The AND gate 34-01 has three inputs, two of which are supplied with the write strobe signal WST via the terminal 1 and a write memory bank designation signal WMD via a terminal 13, respectively. The remaining input terminal is supplied with the selected one of the outputs of the write decoder circuit 32. The AND gate 34-02 also has three inputs, two of which are supplied with the read strobe signal RST via the terminal 7 and a read memory bank designation signal RMD via a terminal 14, respectively. The remaining input terminal is supplied with the selected one of the outputs of the read decoder circuit 33.

In this embodiment, the word lines W0 to W23 are designed to be selected and driven in response respectively to write-address 0 to write-address 11 and write-address 16 to write-address 27. The outputs of the write decoder units 32-0 to 32-11 and 32-16 to 32-27 are connected respectively to the AND gates 34-01 of the driving units 34-0 to 34-23, in that order.

In order to perform the unscrambling operation, therefore, the outputs of the read decoder units 33-0, 33-1, 33-2 and 33-23 for read-addresses 0, 1, 22 and 23 are connected respectively to the AND gates 34-02 of the driving units 34-0, 34-1, 34-22 and 34-23. The outputs of the read decoder units 33-2 to 33-21 for read-addresses 2 to 21 are connected to the AND gates 34-02 of the driving units 34-6, 34-7, 34-12, 34-13, 34-18, 34-19, 34-2, 34-3, 34-8, 34-9, 34-14, 34-15, 34-20, 34-21, 34-4, 34-5, 34-10, 34-11, 34-16 and 34-17, respectively. Thus, the same one among the word lines W2 to W21 is selected and driven in response to the write-address and the read-address having a value different from each other. In other words, the different ones among the word lines W2 to W21 are selected and driven in response, respectively, to the write-address and read-address having the same value.

A write control circuit 35 is provided between the set of data input terminals 15-0 to 15-8 and the each pair of bit lines B and $\overline{B}$ and is activated by the presence of both signals WMD and WST to transfer true and complementary data of each bit of input data to the associated pair of bit lines B and $\overline{B}$. Transfer gate transistors 38 are connected to the bit lines $B_0$ to $\overline{B}_8$ and are turned ON by the read strobe signal RST to transfer the data read from the memory cells to a data read control circuit 36. This circuit 36 is activated by the read memory bank designation signal RMD and produces the read-out data to a set of data output terminals consisting of nine terminals 16-0 to 16-8.

Figure 3A:
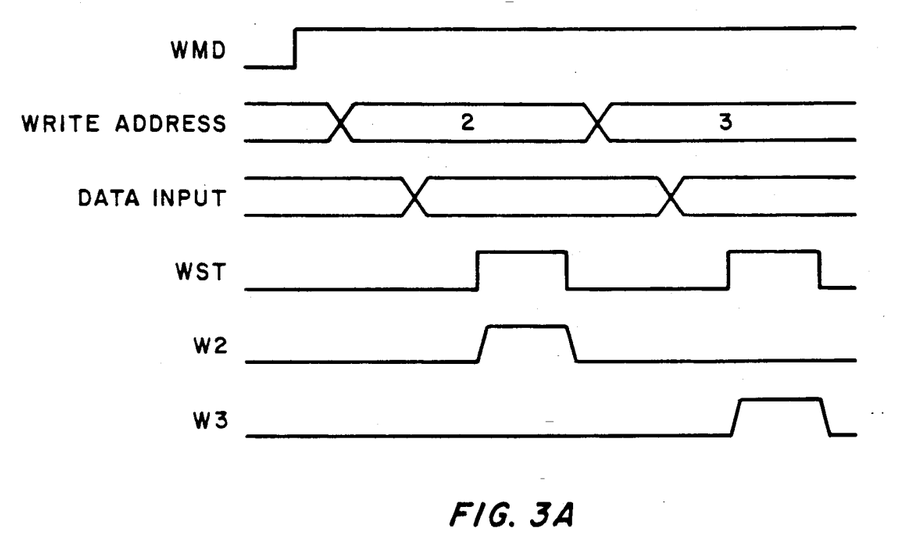
FIGS. 3A and 3B are timing charts representative of a data write operation and a data read operation of the memory circuit shown in FIG. 2.

In a data write operation mode, the write memory bank designation signal WMD takes an active level (a high level), as shown in FIG. 3A. The write-address is supplied to the set of write-address terminals 2-1 to 2-5 (FIG. 2) and the input data is then supplied to the set of data input terminals 15-0 to 15-8. The write strobe signal WST is thereafter changed to an active level (the high level).

Assuming the write-address 2 is supplied, the word line W2 is selected and then driven to the high level, as shown in FIG. 3A. As a result, the inputted nine bits data are written respectively into the nine memory cells connected to the word line W2. The write strobe signal WST is changed to an inactive level. Next write-address 3 and new data are thereafter supplied. In response to the active level of the write strobe signal WST, the word line W3 is driven to the high level to perform the data writing.

Figure 3B:
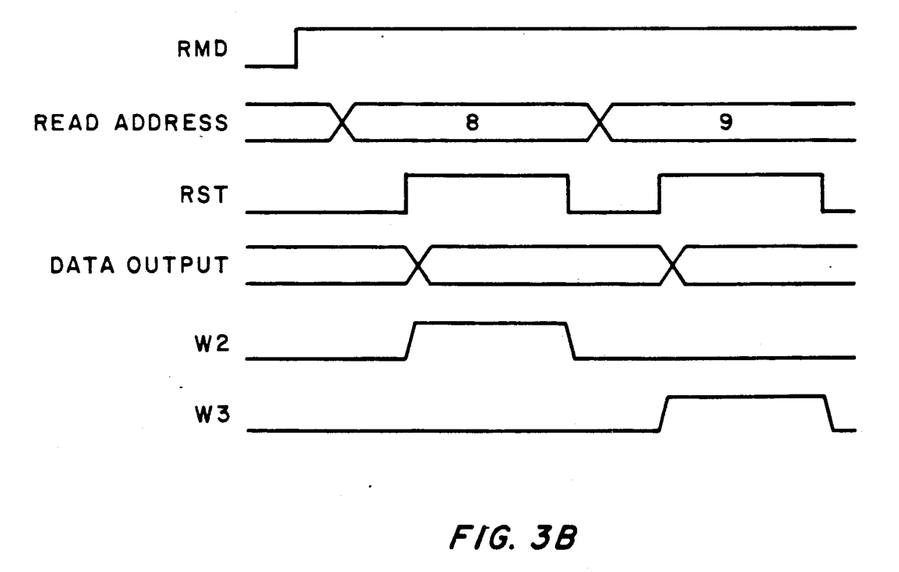

In a data read operation mode, the read memory bank designation signal RMD takes an active level (the high level), as shown in FIG. 3B. The set of read address terminals 8-1 to 8-5 is supplied with read-address 8, for example. The read strobe signal RST is thereafter changed to the high level, so that the word line W2 is selected and driven to the high level. The data stored in the memory cells MC connected to the word line W2 are read out, as shown in FIG. 3B.

During the inactive level period of the signal RST, read-address 9 is supplied. The word line W3 is driven to the high level in response to the active level of the signal RST, the data is read out from the cells MC connected to the word line W3.

Turning back to FIG. 1, the four memory banks M1 to M4 are connected at the data input terminals 15, data output terminals 16, write address terminals 2, read address terminals 8, write strobe terminals 1 and read strobe terminals 7 in common to write data supply terminals 42, read data output terminals 46, write-address supply terminals 44, read-address supply terminals 45, a write strobe supply terminal 44 and a read strobe supply terminal 47, respectively.

A memory bank selector 53 is provided to designate the memory bank M1, M2, M3 or M4 to be placed in the data write mode or data read mode. This circuit 53 supplies the active level to one of four write memory bank designation signals WMD1 to WMD4 which are connected respectively to the terminals 13 of the memory banks M1 to M4. The circuit 53 further supplies the active level to one of four read memory bank designation signals RMD1 to RMD4 which are connected respectively to the terminals 14 of the memory banks M1 to M4.

A frame clock signal RFCK having a cycle corresponding to a time period of one frame is supplied via a terminal 41 to the selector 53. Whenever the selector 53 receives the frame clock signal RFCK, it changes the write memory bank designation signal WMD taking the active level. In this embodiment, the designation signals WMD1 to WMD4 are changed cyclically to the active (high) level in that order. Therefore, assuming that the data of some frame are currently being written into the memory bank M1, the memory bank M4 already stores the data of the frame which is one frame early. The and the memory bank M3 already stores the data of the frame which is two frames early, the memory bank M2 already stores the data of the frame which is three frame early. The selector 53 further receives the third bit data 45-2 of the read-address supplied to the terminals 45 and controls the active level of the read memory bank designation signal RMD1, RMD2, RMD3 or RMD4. The fourth memory bank from the memory bank receiving the data write mode designation is designated to the data read mode when the third bit data 45-2 is "0". The memory bank next the memory bank receiving the data write mode designation is designated to the data read mode when the third bit data 45-2 is "1". As a result, the unscrambling processing of one frame can be executed while the data of the next frame is being written into one memory bank.

Figure 4:
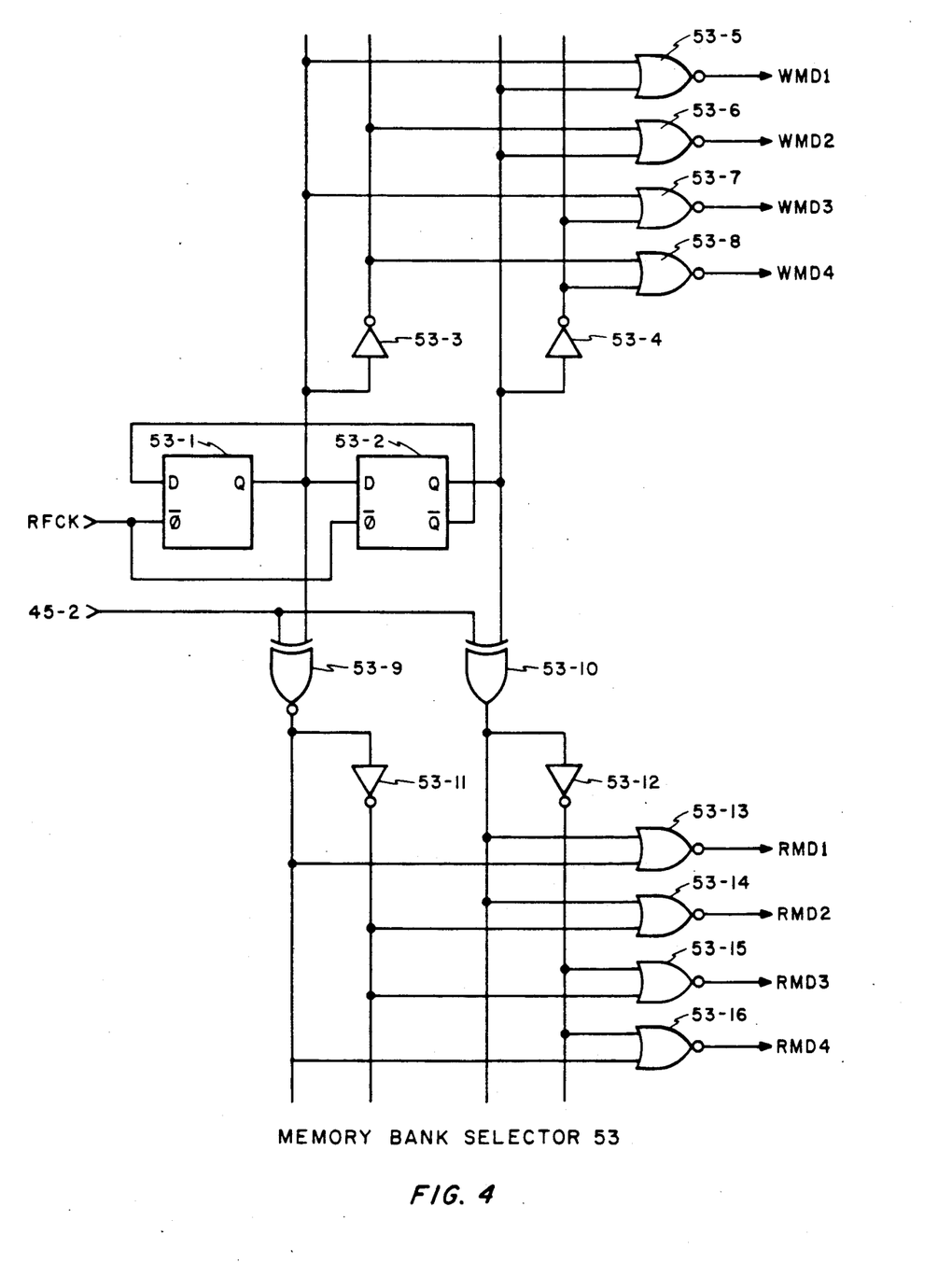
FIG. 4 is a circuit diagram which is representative of a bank selector shown in FIG. 2.
Figure 5:
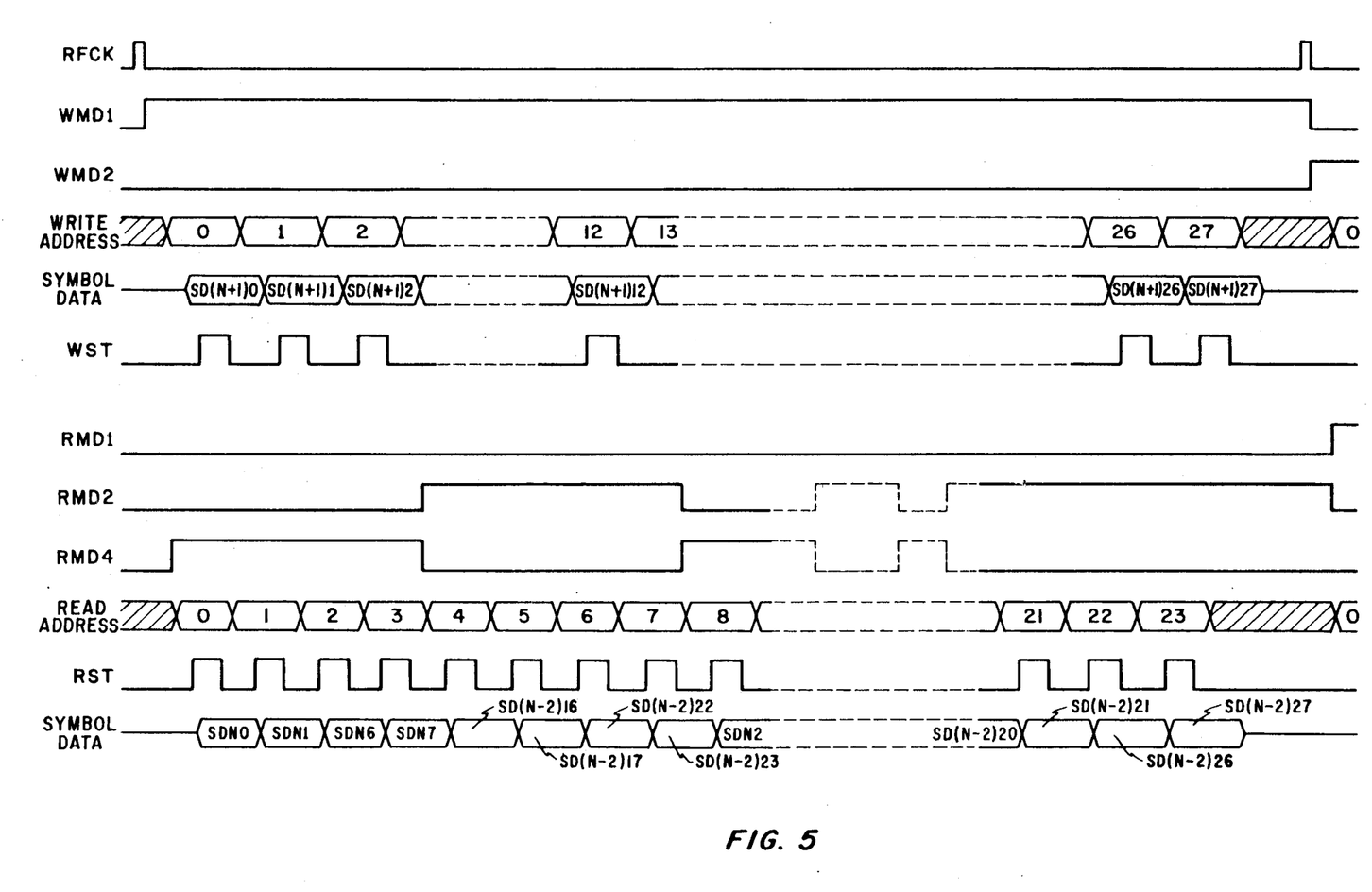
FIG. 5 is a timing chart representative of an operation of the circuit shown in FIG. 1.

Referring to FIG. 4, the memory bank selector 53 includes two D-type flip-flops 53-1 and 53-2 constituting a counter. The count value of selector 53 is incremented by one in synchronism with the falling edge of the frame clock signal RFCK (FIG. 5). The Q-outputs of the flip-flops 53-1 and 53-2 and the inverted outputs thereof through inverters 53-3 and 53-4 are selectively supplied to NOR gates 53-5 to 53-8, as shown in FIG. 4. The gates 53-5 to 53-8 produces the write memory bank designation signals WMD1 to WMD4, respectively. Therefore, the signals WMD1 to WMD4 are changed cyclically changed to the active level in that order whenever the falling edge of the frame clock RFCK appears. The Q-outputs of the flip-flops 53-1 to 53-2 are further supplied respectively to an EX-NOR gate 53-9 and an EX-OR gate 53-10, both of which receives the third bit data 45-2 of the read-address.

The outputs of the gates 53-9 and 53-10 and the inverted outputs thereof through inverters 53-11 and 53-12 are selectively supplied to NOR gates 53-13 to 53-16, as shown in the drawing. The gates 53-13 to 53-16 produces the read memory bank designation signals RMD1 to RMD4, respectively. Therefore, when the third bit data 45-2 is "0" (i.e. when the value of the read-address is 0, 1, 2, 3, 8, 9, 10, 11, 16, 17, 18, or 19), the read memory bank designation signal RMD is supplied to the fourth memory bank from the memory bank receiving data when the write mode designation takes the active level. When the third bit data 45-2 is "1", (i.e. when the value of the read-address is 4, 5, 6, 7, 12, 13, 14, 15, 20, 21, 22, or 23), the read memory bank designation signal RMD is supplied to the memory bank. Next, the memory bank receiving the data write-mode designation takes the active level.

The circuit operation of the unscrambling unit 150 will described below with reference to FIGS. 1 to 6. Assuming that both of the Q-outputs of the flip-flops 53-1 and 53-2 (FIG. 4) take "0" at the falling edge of the frame clock RFCK, the first write memory bank designation signal WMD1 is changed to the active level, so that the memory bank M1, (FIG. 1) receives the data write mode designation. The data of the (N+1)th frame are written into this memory M1. At this time, the data of the Nth and (N−1)th frames have been already stored in the memory bank M4 and M3, respectively. The data of (N−2)th frame, which is two frames late with respect to the Nth frame, have already been stored in the memory bank M2.

The symbol data of the (N+1)th frame and the write-addresses thereof are supplied from the error correction processing unit 140 (FIG. 6) along with the write strobe signal WST. The unit 140 at first supplies a write-address 0 to the address terminals 42 (FIG. 1) and symbol data SD(N+1) 0 to the the terminals 43, and thereafter changes the write strobe signal WST to the active level. As a result, the word line W0 (FIG. 2) in the memory bank M1 is driven to the high level. The data SD(N+1) 0 is written into the cells MC connected to the word line W0. The write strobe signal WST is changed to the inactive (low) level upon completion of the data writing.

Since the write-address calculation is not required, the write-address is incremented by "one" in response to the falling edge of the write strobe signal WST to supply write-address "1" to the terminals 42 (FIG. 1).

When the unit 140 (FIG. 6) prepares next symbol data SD (N+1) 1, it supplies this data SD (N+1) 1 to the terminal 43 (FIG. 1) and then changes the write strobe signal WST to the high level. The word line W1 not directly shown, but represented in FIG. 2) in the memory bank M1 is thereby driven to the high level, so that the data SD(N+1) 1 is written into the cells MC of the word line W1.

In response to the falling edge of the write strobe signal WST, the value of the write-address is incremented to 2. In a similar manner, the word lines W2 to W23 are sequentially driven in that order, in response to the write strobe signal WST, so that each of the remaining symbol data SD(N+1) 2 to SD(N+1) 27 are written into the memory cells MC of the associated word line. However, the symbol data SD(N+1) 12 to SD(N+1) 15 of write-address 12 to write-address 15 are not written since the decoder units thereof are not provided, as described hereinbefore. Thus, 24 symbol data of the (N+1)th frame are written into the memory bank M1 in response the appearance of the next falling edge of the frame clock RFCK.

Simultaneously with the above data writing, the unscrambling operation for the Nth frame is executed. The read-address and read strobe signal RST are supplied from the output processing unit 160, (FIG. 6) and the read-out symbol data are supplied thereto. The unit 160 supplies at first read-address 0 to the terminals 45 (FIG. 1). Since the third bit 45-0 of this address is "0", the fourth memory bank designation signal RMD4 takes the active level to designate the memory bank M4 to the data read mode. Responsive to the active level of the read strobe signal RST, the read decoder unit 33-0 (FIG. 2) in the memory bank M4 produces the high level output to drive the word line W0 via the driving unit 34-0.

As a result, the symbol data SDN0 which has been stored first in the Nth frame is read out and transferred to the unit 160 (FIG. 6) via the terminals 46 (FIG. 1).

Since no read-address calculation is required, the read-address is incremented by "one" in response to the falling edge of the read strobe signal RST. Read-address 1 is thereby supplied to the terminals 45.

In Responsive to the active level of the read strobe signal RST, the word line W1 not directly shown, but represented in FIG. 1) in the memory bank M4 is driven, so that the symbol data SDN1 which has been written second in the Nth frame is read out from the memory cells MC of the word line W1. The read-address is incremented to "2" in response to the falling edge of the signal RST. Since the decoder unit 33-2 of read-address 2 selects and drives the word line W6 through the driving circuit 34, the symbol data SDN6 which has been written seventhly in the Nth frame is read out.

When read-address "4" is supplied to the terminal 45, the third bit 45-2 thereof is "1", so that the second read memory bank designation signal RMD2 takes the active level. The signal RMD4 is changed to the inactive level. The memory bank M2 is thereby designated to the data read mode.

In response to the active level of the read strobe signal RST, the read decoder unit 33-4 of read-address "4" in the memory bank M2 selects and drives the word line W12 via the driving circuit 34 (FIG. 2). As a result, the symbol data SD(N−2) 16 which has been written thirteenth in the (N−2)th frame that is two frame earlier with respect to the Nth frame, is read out from the memory bank M2 and transferred to the output unit 160 (FIG. 6). Since the memory bank M2 is in the data read mode during the period from read-address 5 to read-address 7, the symbol data SD(N−2) 17, SD(N−2) 22 and SD(N−2) 23 are read out and transferred in that order to the unit 160. When the read-address changes to 8, the memory bank M4 is placed in the data read mode, so that the symbol data SDN2 which has been written third in the Nth frame is read out therefrom. Similarly, predetermined symbol data in the Nth and (N−2)th frames are read out in the order shown in FIG. 7 and transferred to the unit 160. Thus, the unscrambling operation for the Nth frame is carried out with incrementing the read-address by "one".

When the falling edge of the next frame clock signal RFCK appears, the second write bank designation signal WMD2 takes the active level, so that the symbol data of the (N+2)th frame are written into the memory bank M2. During the data writing period, the unscrambling operation for the (N+1)th frame is performed.

As described above, the unscrambling unit 150 performs the unscrambling operation for one frame while the data of the next frame is being written, responsive only to an incrementing of the read-address and write-address one by one.

The present invention can be applied to other systems and/or data processors. Moreover, the above embodiments can be modified and changed. For example, the outputs of the write address decoder circuit 32 (FIG. 2) are connected to the driving circuit 34 such that the word lines W0, W1, W8, W9, W16, W17, W10, W11, W18, W19, W4, W5, W12, W13, W20, W21, W6, W7, W16, W15, W22 and W23 are driven in that order in response to the change of write-address from 0 to 27 except for 12 to 15. In this case, the outputs of the read address decoder circuit 33 are connected to the driving circuit 34 such that the word lines W0 to W23 are driven in that order in response to the change of read-address from 0 to 23. Although each of the memory banks M1 to M4 (FIG. 1) includes the write-control circuit 35 and read control circuit 36, only one write control circuit and/or only one read control circuit can be provided in common for the memory banks M1 to M4.

What is claimed is:

1. A data processor comprising a memory circuit, first means for supplying a write address to said memory circuit to write data therein, second means for supplying a read address to said memory circuit to read data therefrom, said memory circuit including a set of first terminals for receiving said write address, a set of second terminals for receiving said read address, a plurality of word lines, a plurality of bit lines crossing said word lines, a plurality of memory cells disposed at intersections of said word and bit lines, fourth means coupled to said set of first terminals for selecting one of said word lines in response to a value of said write address, and fifth means coupled to said set of second terminals for selecting one of said word lines in response to a value of said read address, said fourth means selecting a first one of said word lines in response to a first value of said write address, said fifth means selecting a second one of said word lines that is different from said first word line when said read address takes said first value and selecting said first word line when said read address takes a second value that is different from said first value.

2. The data processor as claimed in claim 1, wherein said fourth means includes a plurality of first input circuits connected respectively to said first terminals and said fifth means includes a plurality of second input circuits connected respectively to said second terminals, each of said first input circuits being activated by a write strobe signal to transfer said write address and being deactivated by a read strobe signal to bring an output thereof into a high impedance state, each of said second input circuits being deactivated by said write strobe signal to bring an output thereof into a high impedance state and being activated by said read strobe signal to transfer said read address.

3. A data processor comprising a memory cell circuit including a plurality of sets of memory cells, a set of write address terminals, first means for supplying a write address to said set of write address terminals and for changing a value of said write address by a predetermined number, second means coupled to said set of write address terminals for selecting one of said sets of memory cells in a first order in accordance with a change in value of said write address, a set of read address terminals, third means for supplying a read address to said set of read address terminals and for changing a value of said read address by said predetermined number, fourth means coupled to said set of read address terminals for selecting one of said sets of memory cells in a second order that is different from said first order in accordance with a change in value of said read address, a write control circuit for writing data into the selected one of said sets of memory cells, and a read control circuit for reading data from the selected one of said sets of memory cells, whereby a writing order of data into said memory cell circuit is different from a reading order of data from said memory cell.

4. The data processor as claimed in claim 3, wherein said predetermined number is one, said first means changing the value of said write address one by one and said third means changing the value of said read address one by one.

5. A data processor comprising: a memory circuit including a plurality of memory cells, a first terminal supplied with a write control signal, a set of second terminals, a set of first tristate circuits each having an input node connected to a corresponding one of said second terminals, a control node connected to said first terminal and an output node, a third terminal supplied with a read control signal, a set of fourth terminals, a set of second tristate circuits each having an input node connected to a corresponding one of said fourth terminals, a control node connected to said third terminal and an output node, a set of signal lines each connected between the output nodes of each of said first tristate circuits and each of said second tristate circuits, decoder means coupled to said set of said signal lines for selecting at least one of said memory cells, at least one data input terminal, write control means coupled to said at least one data input terminal for writing data into the selected memory cell, at least one data output terminal, and read control means for reading data from the selected memory cell and transferring the read data to said at least one data output terminal; a data write circuit for supplying a write address to said set of second terminals, said write control signal to said first terminal, and data to said at least one data input terminal; and a data read circuit for supplying a read address to said set of fourth terminals and said read strobe signal to said third terminal and for receiving data outputted from said at least one data output terminal.

6. A data processor having an unscrambling function, said processor comprising a memory circuit having a matrix of memory cells arranged in columns of words and rows of bits, means responsive to signals applied to a set of write terminals for successively storing data symbols in said memory cells with storage being in the order in which said data is received, means for successively addressing said matrix in response to addresses which are incremented in a predetermined manner, means for applying read address signals to a set of read terminals which are different from said write terminals for controlling a read out of said stored data, and means responsive to said incremented addresses for reading said stored data from said matrix in an order which is different from the order in which said data is received.

7. The data processor of claim 6 wherein said data is received in a scrambled order, and reading means reads out said data in an unscrambled order.

8. The data processor of claim 7 wherein said set of write terminals is coupled to means for driving selected one of said columns of memory cells in response to a given address and said set of read terminals is coupled to means for driving another one of said columns in response to said given address, whereby the same address causes writing and reading of data in two different columns of said matrix.

9. The data processor of claim 7 and means for reading out said other column in response to said incrementing of read addresses applied to said set of read terminals.

10. The data processor of claim 9 and means for generating cyclically recurring stroke signals, and means for switching back and forth between read and write cycles responsive to successive ones of said stroke signals.

11. The data processor of claim 10 and means for causing said incrementing of said addresses between said read and write cycles.

12. The data processor of claim 11 wherein said incrementing of said addresses occurs on a one-by-one basis.

13. A data processor comprising: a plurality of memory banks, each of said memory banks including a plurality of sets of memory cells; a first terminal supplied with a write mode signal for designating said memory bank to be in a write mode; a set of second terminals supplied with a write address; write decoder means coupled to said first terminal and said set of second terminals for selecting respective ones of said sets of memory cells in a first order in accordance with a change of said write address when said write mode is designated; a set of third terminals supplied with data which is to be written; data write means coupled to said first terminal and said set of third terminals for writing the data at said set of third terminals into the selected set of memory cells when said write mode is designated; a fourth terminal supplied with a read mode signal for designating said memory bank to be in a read mode; a set of fifth terminals supplied with a read address; read decoder means coupled to said fourth terminal and said set of fifth terminals for selecting respective ones of said sets of memory cells in a second order, that is different from said first order, in accordance with a change of said read address, when said read mode is designated; a set of sixth terminals; and data read means coupled to said fourth terminal and said set of sixth terminals for reading out data from the selected set of memory cells and transferring the read-out data to said set of sixth terminals; a first unit for supplying said write address in common to the sets of second terminals of said memory banks and said data to be written in common to the sets of third terminals of said memory banks, said first unit successively supplying said data to be written with successively changing of said write address; a second unit supplying said read address in common to the sets of fifth terminals of said memory banks and connected in common to the sets of sixth terminals of said memory banks to receive said read-out data, said second unit receiving said read-out data with successively changing of said read address; and bank selector means coupled in common to the first and fourth terminals of said memory banks for supplying said write mode signal to the first terminal of one of said memory banks and said read mode signal to the fourth terminal of different one of said memory banks, whereby said one memory bank is designated to be in said write mode while said different one memory bank is designated to said read mode.

14. The data processor as claimed in claim 13, wherein each of said memory banks further including a seventh terminal supplied with a write strobe signal and an eighth terminal supplied with a read strobe signal, said write decoder means including a write address input circuit coupled to said seventh terminal and said set of second terminals and activated by said write strobe signal to accept said write address, said read decoder means including a read address input circuit coupled to said eighth terminal and said set of fifth terminals and activated by said read strobe signal to accept said read address, said first unit further supplying said write strobe signal in common to the seventh terminals of said memory banks, and said second unit further supplying said read strobe signal in common to the eighth terminals of said memory banks.

15. The data processor as claimed in claim 14, wherein said write address input circuit includes a plurality of first tristate buffers each having an input node coupled to a corresponding one of said second terminals, a control node coupled to said seventh terminal and an output node, and said address input circuit includes a plurality of second tristate buffers each having an input node coupled to a corresponding one of said fifth terminals, a control node coupled to said eighth terminal and an output node coupled to corresponding one of said first tristate buffer.

* * * * *